United States Patent [19]

Hesselgren

[11] Patent Number: 4,592,138
[45] Date of Patent: Jun. 3, 1986

[54] METHOD FOR EXAMINING CIRCUIT BOARDS

[76] Inventor: Tore G. Hesselgren, Borensvägen 1, S-121 68 Johanneshov, Sweden

[21] Appl. No.: 580,662

[22] Filed: Feb. 16, 1984

[30] Foreign Application Priority Data

Mar. 1, 1983 [SE] Sweden ................................ 8301136

[51] Int. Cl.$^4$ ............................................. H05K 3/02
[52] U.S. Cl. ........................................ 29/846; 29/559; 29/760; 51/216 R; 51/277; 249/129; 269/37; 269/287; 269/903
[58] Field of Search ............... 29/760, 559, 38 C, 846; 51/216 R, 277 R, 161; 269/37, 296, 7, 287, 290, 903; 249/95, 129

[56] References Cited

U.S. PATENT DOCUMENTS

| 3,296,747 | 1/1967 | Philippsen et al. | ............... 51/161 X |
| 3,763,611 | 10/1973 | Dühring et al. | |
| 3,836,111 | 9/1974 | Binder | ............................ 249/129 X |
| 4,463,927 | 8/1984 | Sopori et al. | ...................... 51/277 X |

FOREIGN PATENT DOCUMENTS 125217 2/1970 Denmark .

Primary Examiner—Howard N. Goldberg
Assistant Examiner—Carl J. Arbes
Attorney, Agent, or Firm—Laff, Whitesel, Conte & Saret

[57] ABSTRACT

A method for determining the quality of metal coatings of hole units in a circuit board. Well centered hole units are punched and secured in a container provided with grooves, said holes being aligned, whereafter the container is filled with material for moulding-in the hole units. Thereafter the hole units and filling material are milled down to alignment with the centers of the holes, and the material is milled down additionally around the holes so that the hole unit centers have raised portions. The raised portions comprising the hole plating are thereafter ground and the latter can be examined. The invention also concerns apparatus for performing the above-mentioned method.

1 Claim, 2 Drawing Figures

METHOD FOR EXAMINING CIRCUIT BOARDS

BACKGROUND OF THE INVENTION

1. Field of the Invention

This invention generally refers to examining circuit boards and particularly to a method for determining the quality of plated-through holes in circuit boards.

2. Description of the Prior Art

At the present time there is no other reliable method of examining the plating of circuit boards than to mold test holes in plastic and to grind out a surface along the diameter of a hole. The thickness of the applied metal, notably a copper layer, can then be measured and the quality determined. The disadvantage of the method used up to now is that it requires comparatively large amounts of plastic, the greater part of which must be ground away, which becomes both tedious and expensive.

It is also known in the prior art in surface grinding of different types of material for structural examination to mold said material into an appropriate compound, whereafter the entire body is placed in a fixture for grinding. The fixture for the body to be ground can be structured in different ways, for example in accordance with the description of Danish Pat. No. 125 217 (corresponding to the U.S. Pat. No. 3,763,611 and British Pat. No. 1,352,932), wherein the body to be ground is cylindrical and is provided with a circular flange which engages a correspondingly formed surface of the fixture. In this case, too, a substantial quantity of molding material will have to be ground away.

SUMMARY OF THE INVENTION

However, the above-mentioned arrangement is of entirely different type from the invention proposed by the present application, the object of which is to radically reduce the working time and the amount of necessary plastic material, with the specific features of the invention being disclosed in the appended claims.

BRIEF DESCRIPTION OF THE DRAWING

The invention will be more specifically described with reference to the accompanying drawing which basically shows apparatus in which the invention may be applied, with FIG. 1 illustrating a longitudinal section through a container having hole units introduced therein and FIG. 2 showing a cross section through the container indicating milling and grinding profiles.

DESCRIPTION OF THE PREFERRED EMBODIMENT

Figure 1:
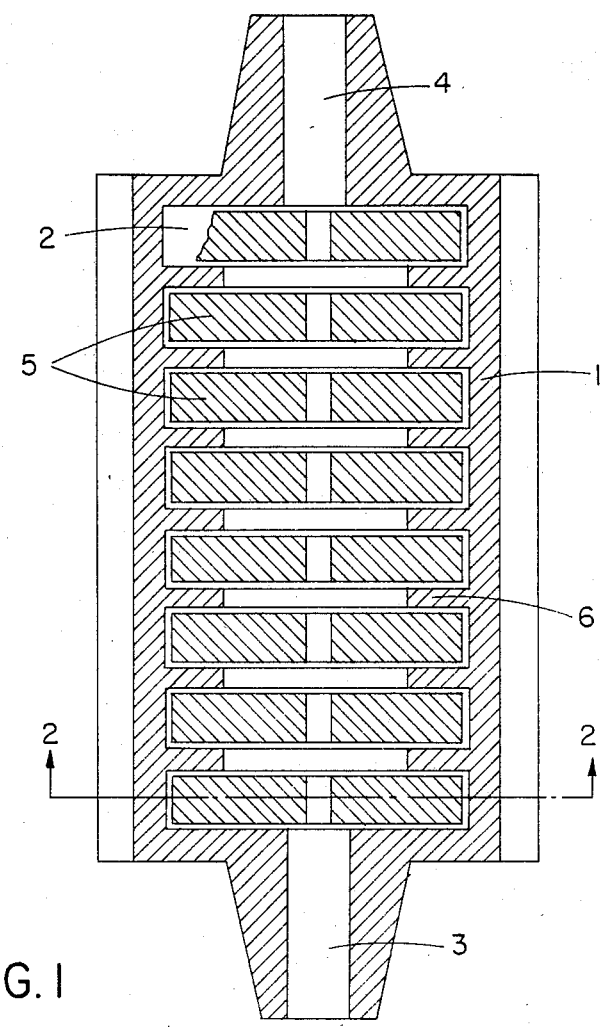

FIG. 1 shows a plastic container 1 which may have an arbitrary cross section which however has been chosen to be a square cross section in the relevant case. A longitudinal side is open, and the interior of the container is formed with a number of well defined, partially interconnected compartments 2. The short sides of the container are provided with centrally located openings 3, 4 for applying pressure and vacuum, respectively, for introducing filling material into the container.

By means of a special tool the hole units are made in the form of round discs having a diameter of for example 8-10 millimeters wherein the holes are accurately centered. Through the open side of the container these discs 5 are then placed in the compartments 2 in which they are supported by projecting guides 6 with the holes accurately fixed along a line through all of the hole centers. The open side of the container is thereafter covered with for example tape 7, and the entire container is filled with for instance plastic via the opening of one of the short walls, for instance 3 and 4, by means of applied pressure and/or vacuum.

Thereafter the plastic container is placed in a simple water-filled pressure chamber in which the pressure may be of the magnitude of 50–100 pounds per square inch and, if desired, at an elevated temperature in order to reduce the curing time.

Due to a comparatively small amount of material being used to fill the container, material of higher quality being considerably better with regard to shrinking and curing at relatively low temperatures can be utilized. These characteristics well outweigh the higher price of the special plastics of the mentioned type. After the curing has been completed the container is placed in an automatic milling and grinding machine having for example 4 or 5 stations. The container is fixed in the machine by means of special guide shoulders 8 which are arranged adjacent to the bottom 10 of the container.

Figure 2:
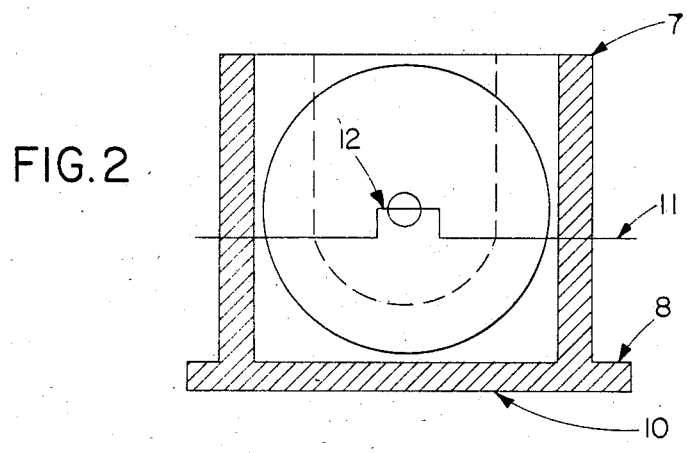

In the first stage of processing the units prepared in the above manner milling is carried out to approximately the centers of the holes which are to be examined, whereafter additional milling of the plastic material on both sides of the holes is performed, whereby a milling profile 11 in accordance with FIG. 2 is attained. This can to advantage be done by means of a special tool which can perform both millings at the same time.

In the subsequent stages grinding is carried out, and this has to be executed only over a narrow area 12 around the holes, whereby substantial savings in grinding belts and grinding time are achieved. Due to the small amount of material to be removed it is even possible to utilize dry grinding. Control of the milling and grinding speed can be performed for example by means of a stepping motor for simplified programming and time savings.

After completed processing in the milling and grinding machine the units can be inspected for example in a microscope so that the quality of the hole plating can be determined. The container can also be utilized for guiding the holes successively into the examining position on the microscope table by means of a simple stepping mechanism.

By means of the method proposed here a substantial amount of time is saved as compared to the method which has been utilized earlier (approximately 10 minutes as compared to approximately 1 hour) at the same time as it is possible to utilize substantially less complicated and lower priced apparatus.

The invention is of course not limited to the embodiment shown and described here, and it may be varied in its scope with regard to various details, for example filling and controlling the container, centering the holes of the units, and the milling and grinding procedures.

The filling agent may be other than plastic, for example tin-lead, and in such case the container may for example be made as a mold, whereby a tin-lead casting having guide shoulders is achieved.

I claim:

1. A method of examining the quality of a metal coating within a connection making hole through a circuit board, wherein said method comprises the steps of:
   punching at least one disc shaped unit from a printed circuit board, said disc having an accurately centered connection making hole containing said metal coating;

positioning a number of such disc shaped units inside a container in a spaced parallel relationship with their connection making holes aligned, said container having a plurality of internal guides for positioning and securing said discs in said spaced parallel relationship;

filling said container with material for molding the container and the disc shaped units secured therein into a solid block;

milling down the block to a surface in alignment with the centers of the connection making holes of the disc shaped units;

additionally milling down the block at the sides of the holes of the disc shaped units for leaving a longitudinally extending raised central portion around and including said holes; and polishing the surface of said raised central portion for enabling an examination of the quality of the metal coating within the holes.

* * * * *